United States Patent [19]

Ashley

[11] Patent Number: 4,952,887
[45] Date of Patent: Aug. 28, 1990

[54] PHASE-LOCK LOOP CIRCUIT HAVING OUTPUTS IN QUADRATURE

[75] Inventor: James R. Ashley, Tampa, Fla.

[73] Assignee: Hercules Defense Electronics Systems, Inc., Clearwater, Fla.

[21] Appl. No.: 295,087

[22] Filed: Jan. 9, 1989

[51] Int. Cl.⁵ .............................................. H03L 7/00
[52] U.S. Cl. ......................................... 331/17; 331/25
[58] Field of Search ...................... 331/10, 11, 16, 17, 331/18, 25

[56] References Cited

U.S. PATENT DOCUMENTS

| | | | |
|---|---|---|---|
| 3,703,686 | 11/1972 | Hekimian | 331/11 |
| 4,514,705 | 4/1985 | Harzer | 331/11 X |
| 4,574,254 | 3/1986 | Glance | 331/25 X |
| 4,827,225 | 5/1989 | Lee | 331/25 X |

OTHER PUBLICATIONS

Glance, Bernard S., New Phase–Lock Loop Circuit Providing Very Fast Acquisition Time, IEEE Transactions on Microwave Theory and Techniques, vol. MTT-33, No. 9, Sep. 1985.

Primary Examiner—Robert J. Pascal
Attorney, Agent, or Firm—Dale R. Lovercheck

[57] ABSTRACT

An active voltage divider circuit is applied to the loop filter of a phase-lock loop, thereby providing a variable gain factor, wherein the gain with large phase error is substantially greater than the gain with small phase error. This results in improved acquisition time for large frequency offsets, while providing in the phase-lock state the same performance as a conventional loop having the same natural loop frequency and damping factor. By sampling the applied radio frequency signal with an amplitude detector and applying the sampled output and the output of a phase sensitive detector to an analog divider, amplitude variations of the input signal are cancelled, thereby making the loop filter essentially independent of the amplitude of the input signal. In a further embodiment the input signal is coupled to a quadrature detector wherefrom I and Q output signals are coupled to a divider which provides error signals to the loop filter that are independent of the input signal amplitude.

9 Claims, 8 Drawing Sheets

PHASE-LOCK LOOP CIRCUIT HAVING OUTPUTS IN QUADRATURE

BACKGROUND OF THE INVENTION

1. Field of the Invention

The invention relates to phase-lock loop circuits, and more particularly to phase-lock loop circuits having improved acquisition time and stability with respect to varying input signal strengths.

2. Description of the Prior Art

Phase-lock loop circuits are widely used for demodulating amplitude modulated, frequency modulated and phase modulated signals. As shown in FIG. 1, these circuits generally comprise basic components, a phase detector, a loop filter, and a voltage controlled oscillator.

A signal to be detected is coupled to the phase detector and compared against the phase of the voltage controlled oscillator (VCO). The error signal provided by the phase detector is filtered by the loop filter and applied as a frequency control voltage to the VCO. This control voltage is applied to the VCO in a manner to alter its phase in a direction that reduces the phase difference between the input signal and the VCO output.

Acquisition time of a second-order phase-lock loop can be prohibitively long when the initial frequency offset between the input signal and the VCO output signal is large compared to the loop natural frequency. In conventional phase-lock loops, loop gain decreases when large phase errors are encountered, an effect which is opposite to that desired. When large phase errors are encountered, a high loop gain is desired to quickly reduce the phase error. After the error is reduced, the gain should be lowered to dampen the loop settling transient.

An improved version of a phase-lock loop circuit is described in "New Phase-Lock Loop Circuit Providing Very Fast Acquisition Time," Bernard S. Glance, IEEE Trans MTT, Vol MTT-33, No. 9, Sept. 1985, p. 747 ff. For small phase error the loop gain is designed for optimum transient damping. For large phase error the gain is increased to reduce the loop acquisition time accordingly. As shown in FIG. 2, the circuit differs from the conventional loop by the addition of a diode network in series with an active filter 2 of a conventional second order loop. Diodes 3 and 4 are shunted by a resistance 5 whose value is much less than the effective resistance of the diode pair in the non-conducting state. Diodes 3 and 4 remain in the non-conducting state until a predetermined forward bias voltage is exceeded. When diodes 3 and 4 are in the non-conducting state a normal gain factor is provided by resistors 5 and 6. This results in a normal operating zone as shown in FIG. 3. When the magnitude of the error signal from the phase detector exceeds a predetermined level one of the diodes conducts, shunting the resistor 5 by the diode forward resistance and reducing the input resistance coupled to the operational amplifier and thereby increasing the amplifier gain.

The circuit of FIG. 2 is not optimum from a noise threshold viewpoint. The present invention improves the noise figure while reducing the number of required components and provides the same dynamic response as does the Glance circuit shown in FIG. 2.

A further deficiency of conventional phase-lock loop circuits occurs when such circuits are used for demodulating FM or PM signals. In these applications when the applied input signal is not adequately limited, a varying input signal strength adversely affects the phase-lock loop performance. The present invention accepts an inadequately limited input signal and provides optimum performance from the phase-lock loop by eliminating the affect of the input signal amplitude on the open loop DC gain.

SUMMARY OF THE INVENTION

In accordance with the principles of the resent invention, improved phase-lock loop performance is realized with a variable gain loop filter. This filter comprises an amplifier coupled to a variable gain integrator. Signals coupled from the phase detector are amplified prior to integration, thereby providing an improved noise figure relative to that provided by the prior art. The variable gain integrator comprises a conventional operational amplifier integrator proceed by a parallel circuit which includes a resistor and back-to-back diodes. When the amplified error signal from the phase detectors exceeds a predetermined magnitude, one of the diodes conducts, shunting the resistor by the diode forward resistance, a value much smaller than that of the resistor. This resistance value reduction includes the gain of the integrator and concomitantly, the loop gain In a second preferred embodiment, the input signal to the phase detector is sampled to provide a portion thereof to an amplitude detector. The sampled signal and the output of the phase detector are coupled to a divider circuit wherein one signal is divided by the other to provide a quotient signal having an amplitude that is independent of the magnitude of the input signal coupled to the phase detector. The quotient signal is then coupled to the loop filter, thus providing an error signal to the VCO that is independent of the input signal amplitude. In this manner DC loop gain independent of the input signal amplitude is established.

DESCRIPTION OF THE PREFERRED EMBODIMENT

Figure 4:
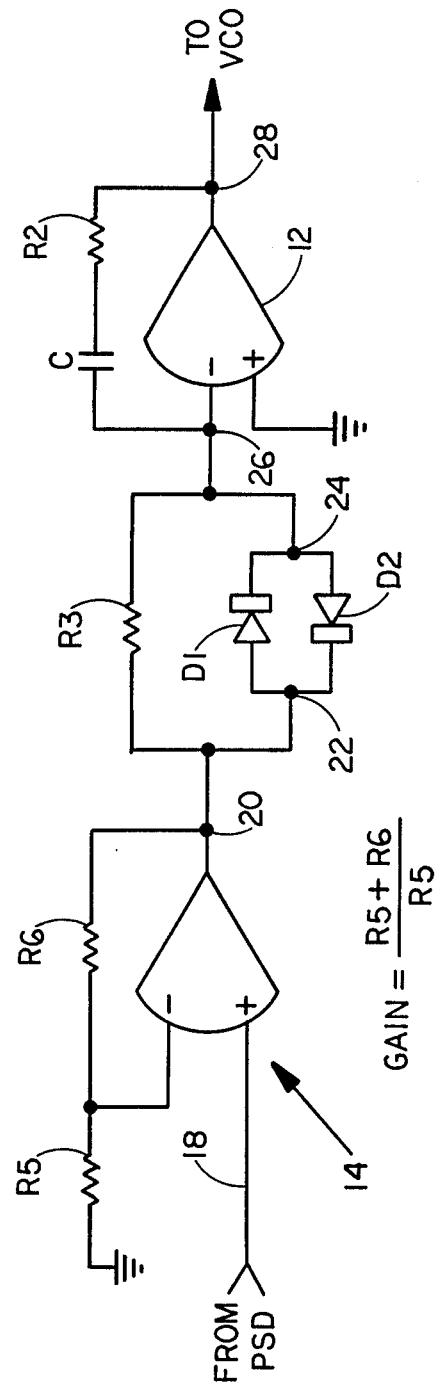
FIG. 4 is an electrical schematic diagram of an improved loop filter of the present invention.

Refer now to FIG. 4, wherein a loop filter for a phase-lock loop of the present invention is shown. An amplifier 14 is coupled to a non-linear resistance comprising the parallel circuit of R3, D1 and D2, which in turn is coupled to an operational amplifier with feedback 12. The parallel circuit and the operational amplifier 12 combination form a variable gain integrator the operation of which is to be explained. The amplifier 14 is an operational amplifier which is configured to provide constant gain, low noise amplification. This is accomplished by coupling the feedback to the inverting terminal through resistors R6 and R5 and coupling the signal on line 14 directly to the non-inverting terminal. Such an arrangement improves the noise figure by at least the number of dB of signal drop across the input resistor, had the input been coupled via the non-inverting terminal. Output terminal 20 of amplifier 14 is coupled to the inverting input of amplifier 12 through the parallel network R3, D1, D2, wherein diodes D1 and D2 are coupled back-to-back, the anode of one coupled to the cathode of the other. A resistor R2 and capacitor C are serially coupled from the inverting input 26 of amplifier 12 to the output 28, thereby establishing an integrator circuit, while the output terminal 28 is further coupled to the VCO. In the phase lock-loop state both diodes are non-conducting since the phase error signal amplitude is below the cut-off voltages of the diodes, thereby providing a combined diode resistance that is much larger than R3. In this situation R3 determines the gain of the integrator. The resistance R3 is adjusted to provide the same performance in the phase-locked state as a conventional loop having the same natural frequency and damping factor. An error signal exceeding a predetermined voltage, as for example 0.6 volts, drives one of the diodes into conduction, which diode conducts is a function of the polarity of the error signal. In this mode, the gain of the integrator is significantly increased, thereby increasing the loop gain to a value that may be several hundred times larger than that provided by the conventional loop. Thus a low noise, component efficient; variable gain loop that provides rapid acquisition at large frequency errors is realized.

Figure 5:
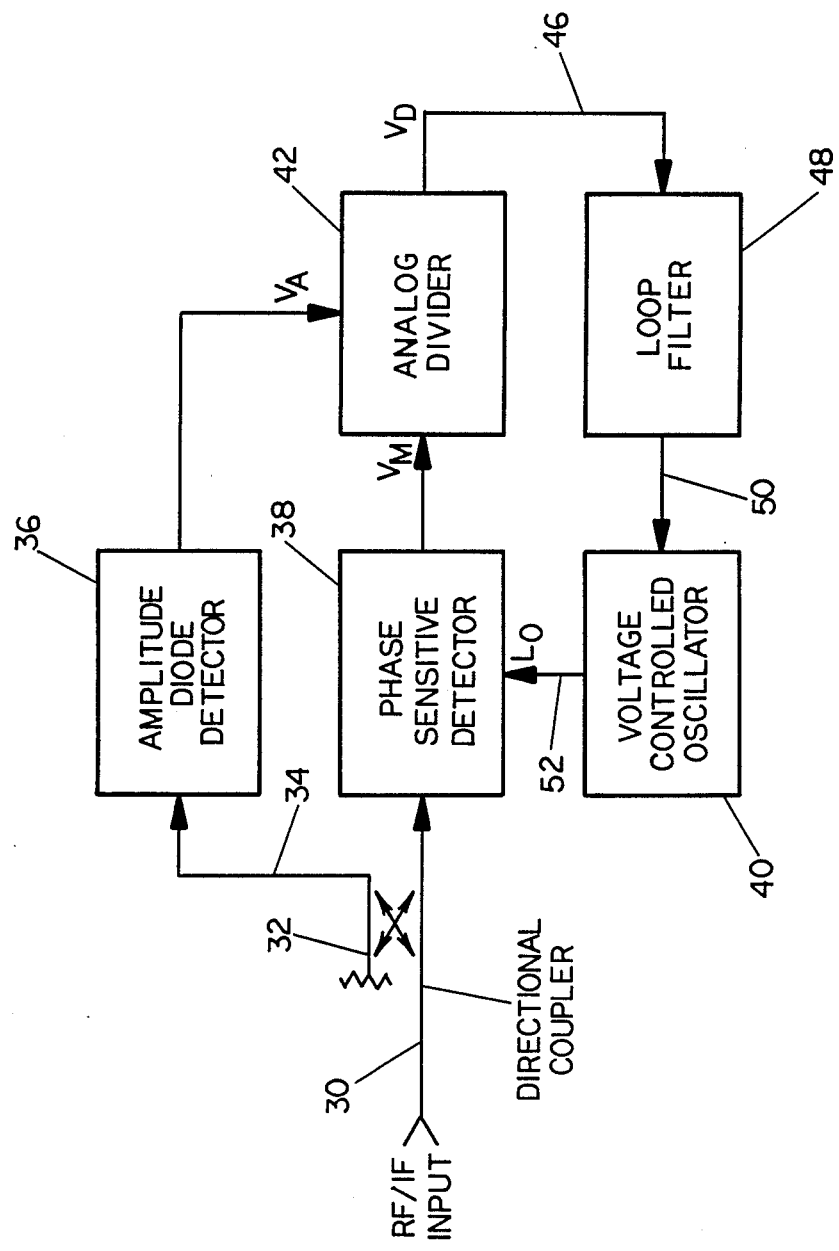
FIG. 5 is a block diagram of a phase-lock loop incorporating the analog divider of the present invention.

Referring now to FIG. 5, after pre-selection and amplification at an intermediate frequency, a signal to be FM or PM demodulated is applied to the radio frequency input 30 of the phase-lock loop. This circuit differs from that of the prior art phase-lock loop by the addition of a coupling network 32, which extracts a portion of the input signal for processing, and an analog divider 42. When loop lock is established and the circuit is tracking the input signal, the error voltage $V_M$ at the output of the phase sensitive detector 38 is the modulation information on the input signal. While it is generally assumed that the intermediate frequency amplifiers will provide full limiting, this may not be the case in practical applications. If limiting is inadequate, then the varying input signal strength adversely affects the phase-lock loop performance. The output of the phase sensitive detector is of the form $$V_M = A_0 k_{pd} \sin \phi \quad (1)$$

where $k_{pd}$ is a gain constant of the phase sensitive detector, $\phi$ is the phase angle difference, usually desired modulation information, and $A_0$ the amplitude of the input signal. When the loop is in the tracking mode, the error angle is small and $$\sin \phi = \phi \quad (2)$$

Thus, the open loop DC phase error gain is a function of the input signal amplitude. DC gain variation with the input signal strength cause corresponding loop tracking gain variations. It is therefore desirable to eliminate the amplitude of the input signal from the loop gain to improve the performance of the circuit.

Elimination of the DC loop gain dependency on the input signal level may be obtained by the addition of an analog divider 42. The radio frequency input signal on line 30 is applied to a directional coupler 32 which diverts a small fraction of the signal via on line 34 to an amplitude detector 36, while the largest portion of the signal is applied to the phase sensitive detector 38. The output $V_M$ of the phase detector 38 is coupled to analog divider 42 along with the output signal from the amplitude detector 36. Divider 42 provides an output $V_D$ which is the quotient of the output of the phase sensitive detector 38 divided by the output of the amplitude detector 36. Analog divider 42 may be adjusted to provide a nominal gain factor of 10. The divider output is applied via lead 46 to loop filter 48 which may be a conventional loop filter or the improved circuit described herein. The output of loop filter 48 is coupled to a voltage control oscillator 40 and the output thereof applied via lead 52 to phase detector 38.

In operation the major portion of the signal power is applied to the input port of the phase sensitive detector 38. Coupler 32 may be any suitable form of power divider, since the directional properties of the coupler are not essential to this invention. The sample from coupler 32 may be of the order of 3-6 dB below the input. This sample is applied to an amplitude detector 36 to obtain DC voltage proportional to the input signal amplitude. This DC voltage $V_A$ is applied as the divisor input to analog divider 42 and the output $V_M$ of detector 38 is applied to the numerator input. Thus, with a scaling factor of 10 for a tYpical analog divider operated from plus and minus 15 V DC power supplies, the output of divider 42 may be $$V_d = 10 V_M / V_A$$

By the action of the detector 36 and divider 42, a signal which is only a function of the phase difference between the input signal and the VCO is coupled to the loop filter 48. Thus, a phase error loop gain which is independent of the input signal amplitude is obtained.

Figure 6:
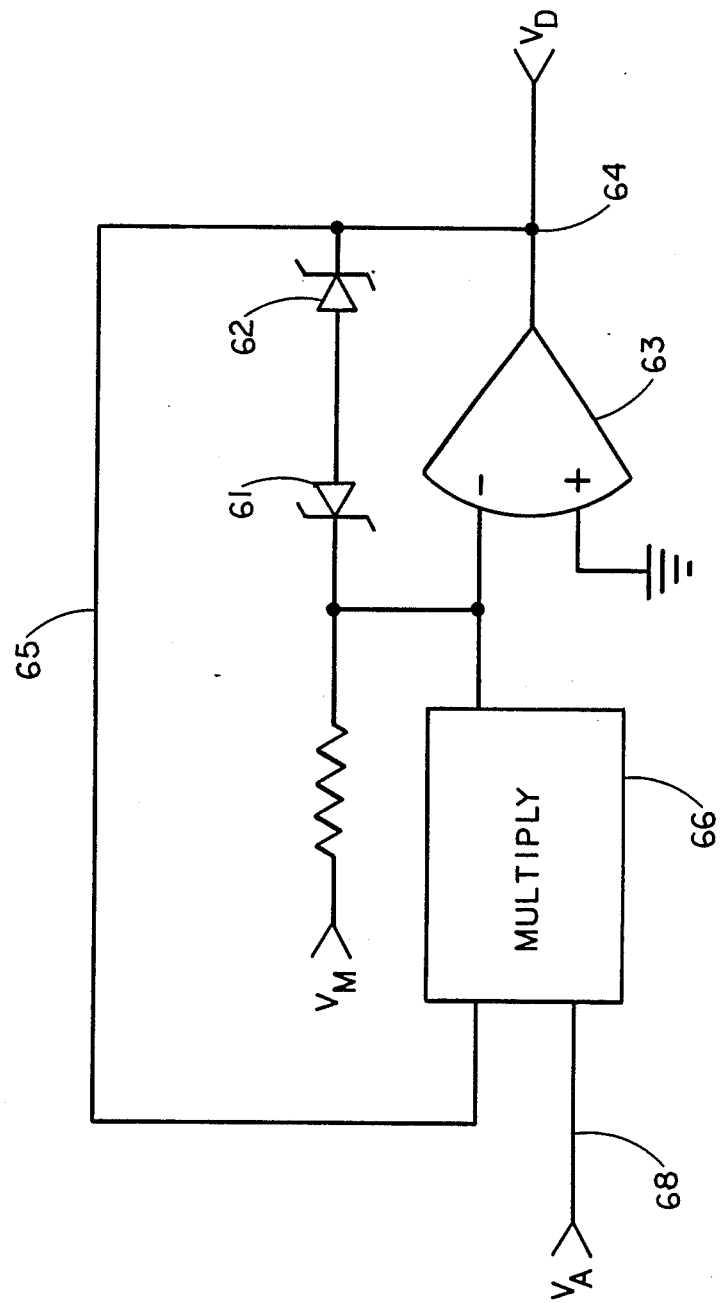
FIG. 6 is an electrical schematic diagram showing details of the analog divider of FIG. 5.

Conventional analog divider circuits may be driven into saturation when small divisors are applied. Saturation of a divider circuit may be prevented by coupling back to back zener diodes 61 and 62 in parallel with the feedback circuit of the operational amplifier 63 in a divider circuit, as shown in FIG. 6. The input to the multiplier $V_A$ must be positive and the polarity of the zener diodes is chosen accordingly. The output 64 of the operational amplifier 63 is coupled via a lead 65 to one input of multiplier 66 while the output $V_A$ of amplitude detector 36 is coupled to a second input via lead 68. Multiplier 66 is constructed to provide a gain factor of 10 and the output thereof is coupled via lead 69 to an input terminal of operational amplifier 63, to which the output of the phase detector 38 is also coupled.

In operation, for the limiting case of both inputs being 10 V, the output will also be 10 V. When the input signal amplitude is small, both input voltages are small but the ratio may still be of the order of 10. Zener diodes 61 and 62 will keep the operational amplifier 63 from saturating when the output level tries to exceed 10 V.

Figure 7:
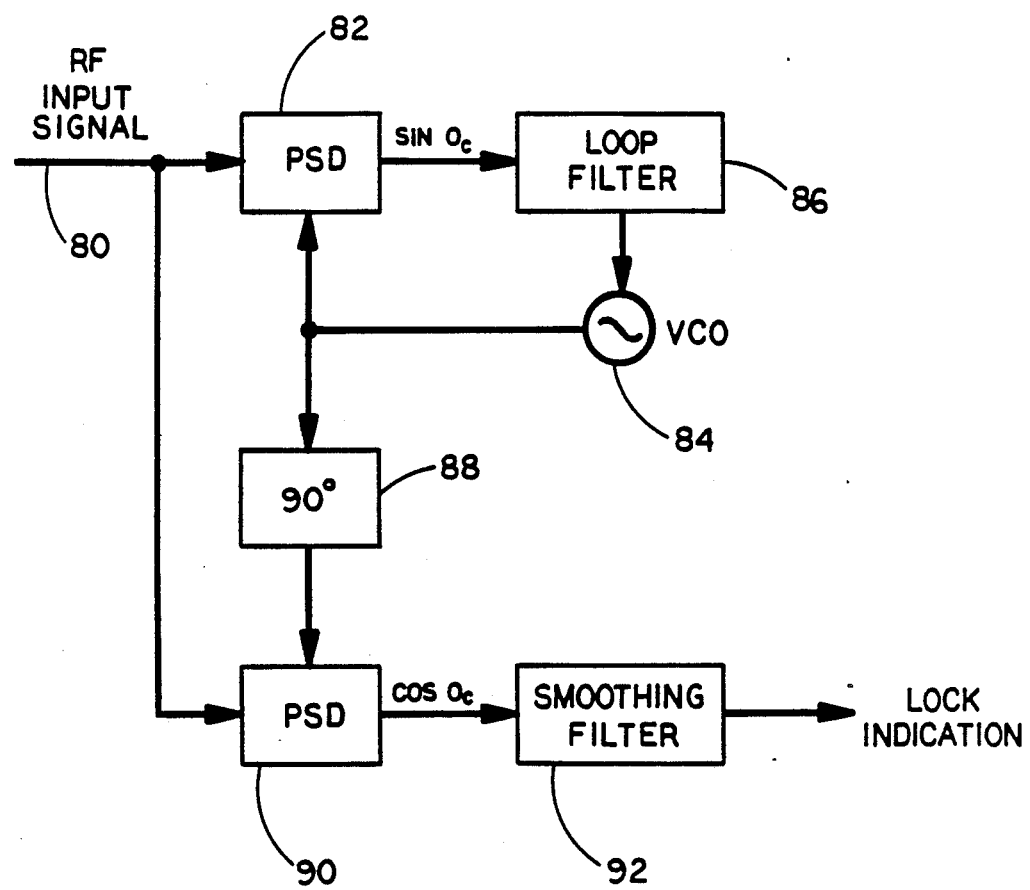
FIG. 7 is a block diagram of a quadrature detector useful for indicating phase lock in a phase-lock loop.

A further application of the phase-lock loop is shown in FIG. 7. An inphase mixer and quadrature mixer may be combined in a circuit known as an I-Q PSD.

Figure 8:
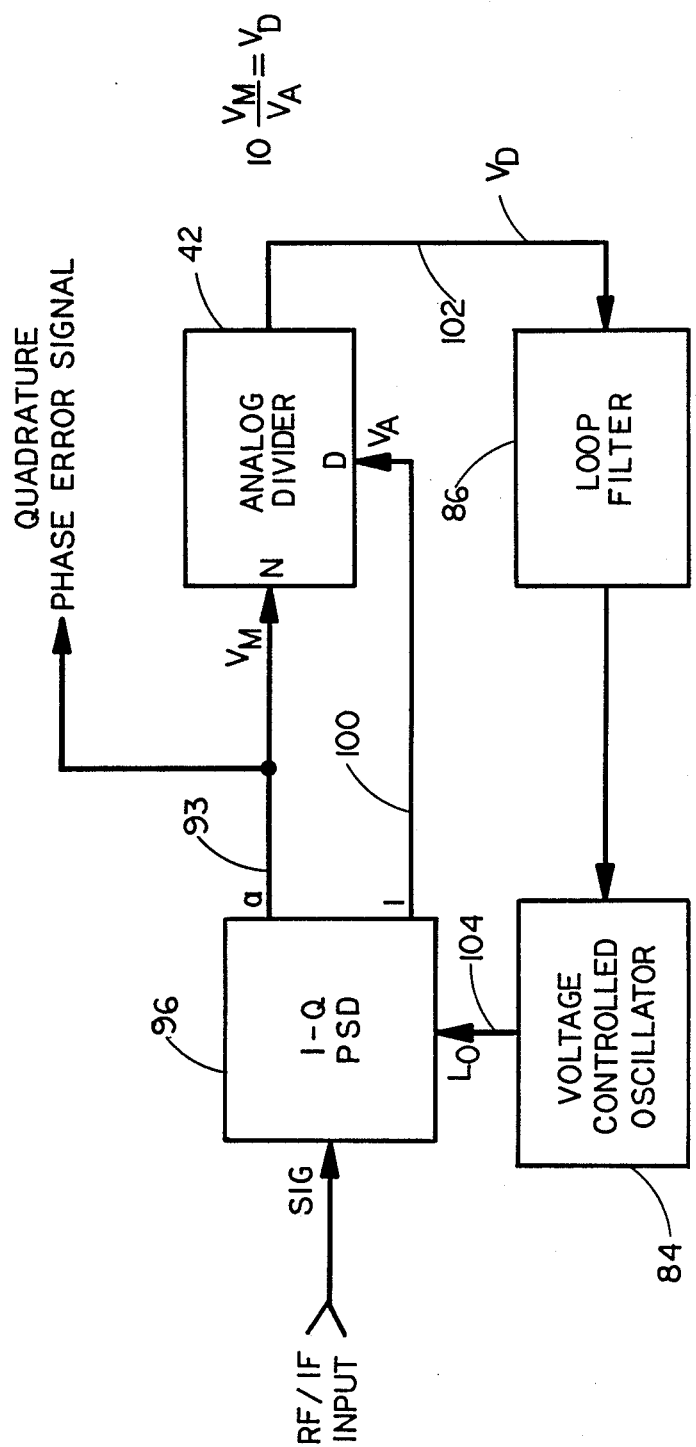
FIG. 8 is a block diagram showing the application of the analog divider of the present invention to a quadrature detector.

As shown in FIG. 8, an input signal 80 is applied to a phase sensitive detector 82. A voltage controlled oscillator 84 is coupled to the detector 82 through a loop filter 86 to provide an output error signal from detector 82 having a value proportional to the sine of the phase difference of the signals applied to the detector. The VCO output is also coupled to a phase shift network 88 and applied to a quadrature phase detector 90. Quadrature detector 90 also receives the RF input signal 80 and thereby provides an output signal proportional to the cosine of the phase error. The cosine error signal may then be applied to a smoothing filter 92 wherefrom a lock indication signal is provided.

The application of the analog divider to quadrature detector of FIG. 7 is shown in FIG. 8. The Q output of the quadrature detector 96 on lead 98 is applied to analog divider 42, while the I output on lead 100 is applied as the denominator input of divider 42. The quotient signal on lead 102 is applied via loop filter 86 to VCO 84, the output of which is coupled to the I–Q detector via lead 104. The I and Q output signals provided by the I–Q detector 96 in response to a RF signal are applied to analog divider 42, wherefrom a signal, representative of the tangent of the phase error, is coupled to the loop filter 86.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. In a phase-lock loop circuit including a phase detector and a voltage controlled oscillator the improvement comprising:
    amplifier means coupled to directly receive signals from said phase detector;
    integrator means having an output terminal coupled to a control terminal of said voltage controlled oscillator and an input terminal for providing signals at said output terminals that are representative of integrated values of signals coupled to said input terminal;
    non-linear resistance means coupled between amplifier means and said input terminal of said integrator means, for providing a first resistance value when signals from said amplifier means are of a magnitude below a predetermined value and a second resistance value when signals from said amplifier means are of a magnitude that exceeds said predetermined value, said non-linear resistance means and said integrator means combining to establish a variable gain integrator.

2. A phase-lock loop circuit including an input terminal, a voltage controlled oscillator, a phase detector responsive to signals coupled from said input terminal and said voltage controlled oscillator to provide error signals, and a loop filter coupled to control terminals of the voltage controlled oscillator comprising:
    signal sampling means coupled to said input terminal for sampling input signals and providing sample signals representative of said input signal;
    divider means responsive to said error signals and said sample signal for providing quotient signals representative of said error signals to said loop filter that are independent of amplitude variations of said input signals.

3. A phase-lock loop circuit as set forth in claim 2, wherein said loop filter comprises:
    integrator means having an output terminal coupled to a control terminal of said voltage controlled oscillator and an input terminal for providing signals at said output terminal that are representative of integrated values of signals coupled to said input terminal;
    non-linear resistance means coupled between said divider means and said input terminal of said integrator means for providing a first resistance value when signals from said divider means are of a magnitude below a predetermined value and a second resistance value when signals from said dividers have a magnitude that exceeds said predetermined value, said non-linear resistance means and said integrator means combining to establish a variable gain integrator.

4. A phase-lock loop circuit as set forth in claim 3, wherein said non-linear resistance means comprises a pair of diodes having a predetermined forward conduction voltage coupled in parallel with opposing polarities and further comprising a resistor shunted across said diodes.

5. A phase-lock loop circuit as set forth in claim 4 wherein said predetermined conduction voltage is 0.6 V.

6. A phase-lock loop circuit as set forth in claim 4 wherein said divider means comprises:
    differential amplifier means having a first input terminal coupled to receive said sample signals, a second input terminal coupled to ground and an output terminal for providing said quotient signals, first and second semi-conductive elements connected in series opposition and having a first anode connected to said first input terminal of said differential amplifier means and a second anode connected to said output terminal of said differential amplifier means, said semi-conductors responsive to a predetermined level of said quotient signal for providing a signal opposing said input signal so that said quotient signal does not exceed a further predetermined value established by a predetermined reverse bias voltage of at least one of said semi-conductive elements.

7. The phase-lock loop circuit as set forth in claim 6 wherein said first and second semi-conductive elements comprise Zener diodes.

8. A phase-lock loop circuit including an input terminal, a voltage controlled oscillator, a phase detector responsive to signals coupled from said input terminal and said voltage controlled oscillator to provide error signals, and a loop filter coupled to control terminals of the voltage controlled oscillator comprising:
    signal sampling means coupled to said input terminal for sampling input signals and providing sample signals representative of said input signal;
    divider means responsive to said error signals and said sample signal for providing quotient signals representative of said error signals to said loop filter that are independent of amplitude variations of said input signals; and
    integrator means having an output terminal coupled to a control terminal of said voltage controlled oscillator and an input terminal for providing signal at said output terminal that are representative of integrated values of signals coupled to said input terminal.

9. A phase-lock loop circuit as set forth in claim 8 wherein said loop filter comprises:

non-linear resistance means coupled between said divider means and said input terminal of said integrator means for providing a first resistance value when signals from said divider means are of a magnitude below a predetermined value and a second resistance value when signals from said dividers have a magnitude that exceeds said predetermined value, said non-linear resistance means and said integrator means combining to establish a variable gain integrator.

* * * * *

UNITED STATES PATENT AND TRADEMARK OFFICE
CERTIFICATE OF CORRECTION

Page 1 of 3

PATENT NO. : 4,952,887
DATED : August 28, 1990
INVENTOR(S) : James R. Ashley It is certified that error appears in the above-identified patent and that said Letters Patent is hereby corrected as shown below:

On the title page, the Abstract should read as follows:

ABSTRACT

A non-linear voltage divider circuit is applied to the loop filter of a phase-lock loop, thereby providing a variable gain factor, wherein the gain with large phase error is substantially greater than the gain with small phase error. This results in improved acquisition time for large frequency offsets, while providing in the phase-lock state the same performance as a conventional loop having the same natural loop frequency and damping factor. By applying a portion of the radio frequency signal to an amplitude detector and applying the detected output signal and the output of a phase sensitive detector to an analog divider, amplitude variations of the input signal are cancelled, thereby making the loop filter essentially independent of the amplitude of the input signal. In a further embodiment the input signal is coupled to a quadrature detector wherefrom I and Q output signals are coupled to a divider which provides error signals to the loop filter that are independent of the input signal amplitude.

Figure 1:
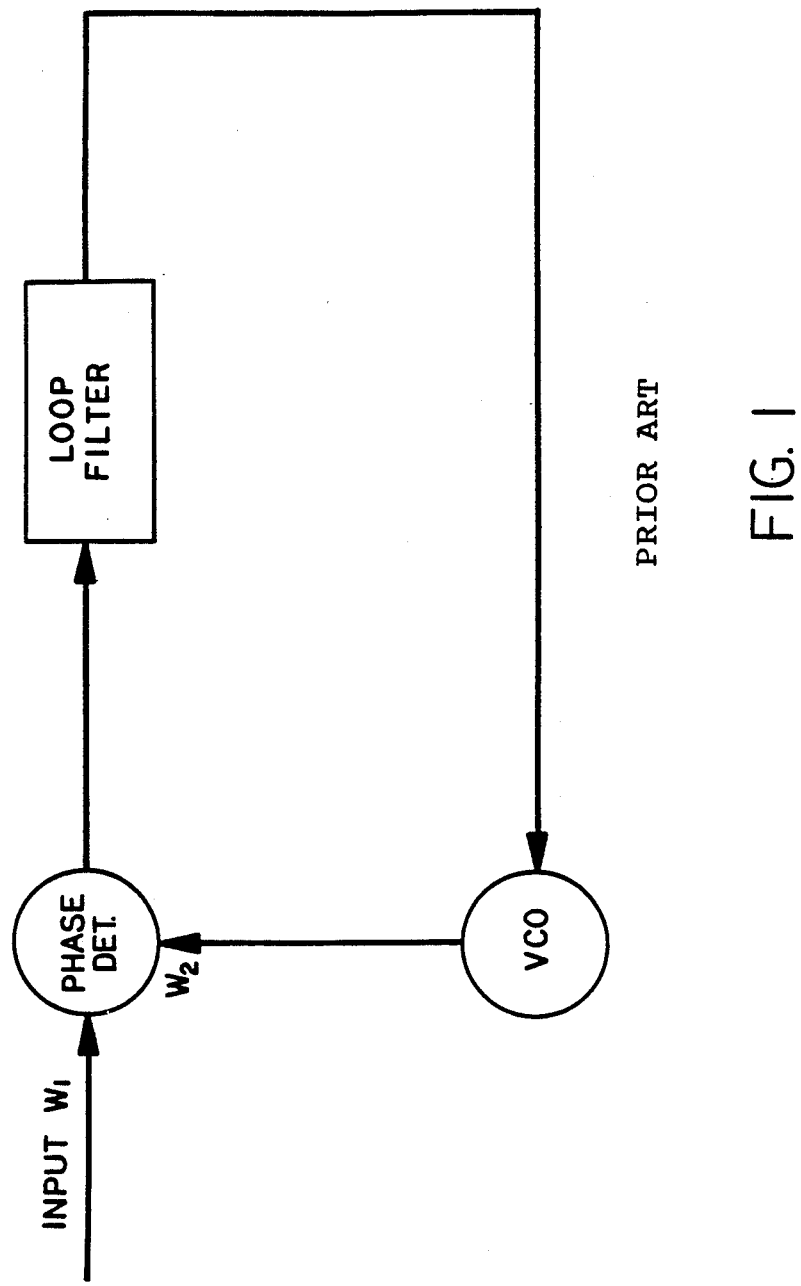
FIG. 1 is a block diagram of a prior art phase-lock loop circuit.
Figure 2:
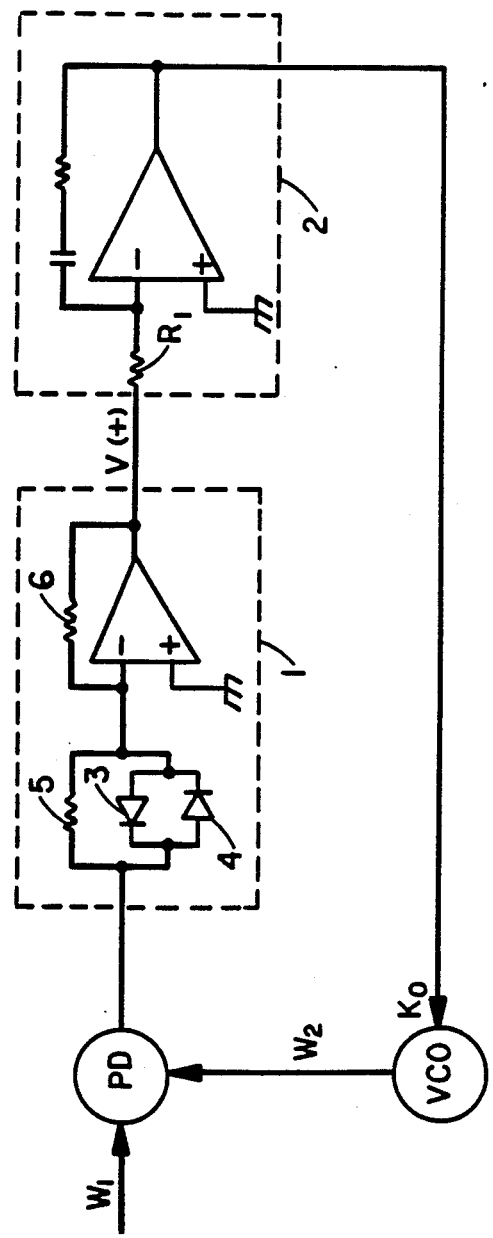
FIG. 2 is a schematic diagram of a phase-lock loop of the prior art.
Figure 3:
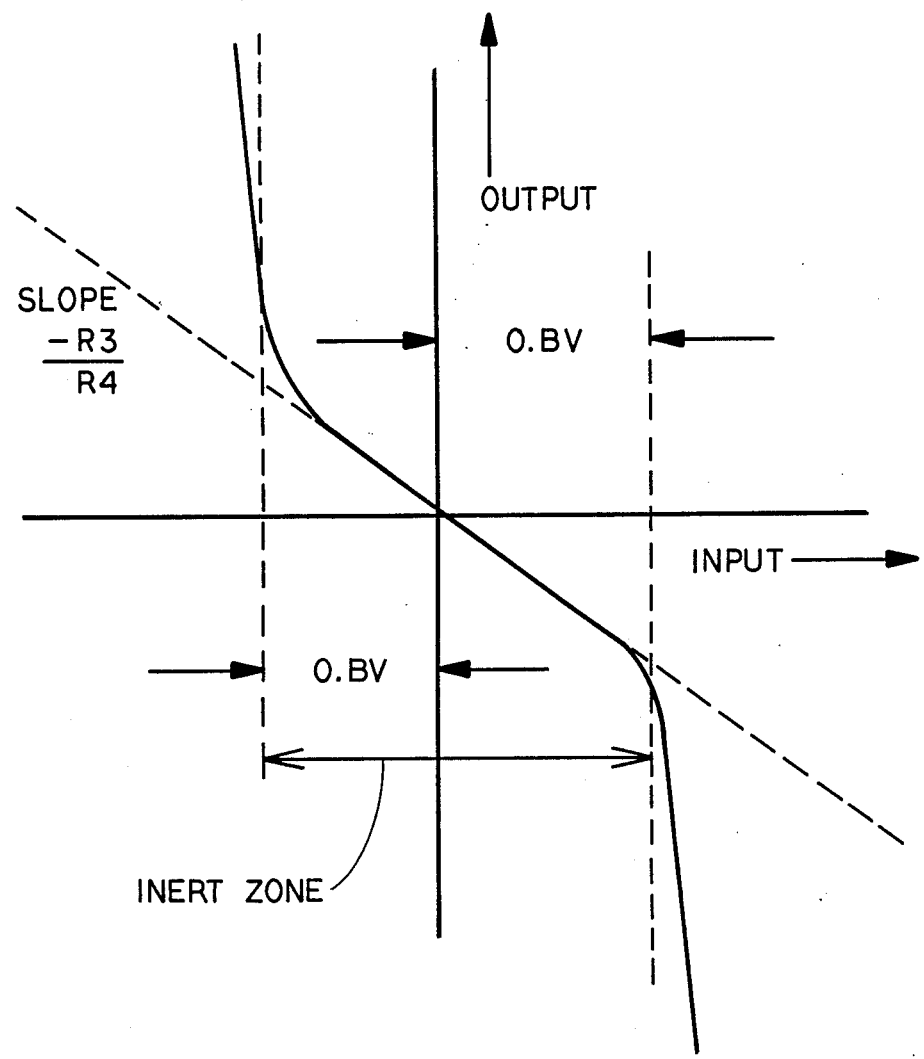
FIG. 3 shows the transfer characteristic of the loop circuit of FIG. 2.

Col. 1, line 54, "results in a normal operating zone as shown in FIG. 3." should read --results in a normal operating zone, indicated as the "inert zone" in FIG. 3--;

Col. 2, line 10 "resent" should read --present --;

Col. 3, line 8, delete "input been coupled via" and insert --feedback circuit been coupled to--;

UNITED STATES PATENT AND TRADEMARK OFFICE
CERTIFICATE OF CORRECTION

PATENT NO. : 4,952,887

DATED : August 28, 1990

INVENTOR(S) : James R. Ashley

It is certified that error appears in the above-identified patent and that said Letters Patent is hereby corrected as shown below:

Col. 3, line 28, "polarity" should read --phase --;

Col. 4, line 31, "tYpical" should read --typical--;

Col. 4, line 45, delete "in parallel with the" and insert --to establish a second--;

Col. 4, line 46, "of" should read --for--;

Col. 4, lines 53 to 56, "Multiplier 66 is constructed to provide a gain factor of 10 and the output thereof is coupled via lead 69 to an input terminal of operational amplifier 63, to which the output of the phase detector 38 is also coupled." should be deleted and replaced with --Multiplier 66 provides a signal proportional to the product of $V_D$ and $V_A$. The output terminal of multiplier 66 is coupled via lead 69 to an input terminal of operational amplifier 63, to which the output signal $V_M$ of the phase detector 38 is also coupled.--;

Col. 4, line 64, delete "mixer" both occurrences and insert in both occurrences --phase detector--;

Col. 4, line 65, "I-Q PSD" should read -- I-Q phase sensitive detector (PSD)--;

Col. 4, line 68, after "the" insert --phase sensitive--;

UNITED STATES PATENT AND TRADEMARK OFFICE
CERTIFICATE OF CORRECTION

PATENT NO. : 4,952,887

DATED : August 28, 1990

INVENTOR(S) : James R. Ashley

It is certified that error appears in the above-identified patent and that said Letters Patent is hereby corrected as shown below:

Col. 5, line 4, After "a" insert --90°--;

Col. 5, line 5, "quadrature" should read -- second --;

Col. 5, line 5, after "phase" insert --sensitive--;

Col. 5, lines 5 and 6, "Quadra- ture" should read --The second phase--;

Col. 5, lines 6 and 7, "and thereby" should read --and, by virtue of the 90° phase shift of the VCU signal,--;

In the Claims, Col. 5, Claim 1, line 35 "directlY" should read --directly--; and Col. 6, lines 63 and 64, "signal" should read --signals--.

Signed and Sealed this

Eleventh Day of January, 1994

BRUCE LEHMAN

*Attest:*

*Attesting Officer*   *Commissioner of Patents and Trademarks*